United States Patent [19]

Lee

[11] Patent Number: 5,089,867

[45] Date of Patent: Feb. 18, 1992

[54] HIGH CONTROL GATE/FLOATING GATE COUPLING FOR EPROMS, E²PROMS, AND FLASH E²PROMS

[75] Inventor: Ruojia Lee, Boise, Id.

[73] Assignee: Micron Technology, Inc., Boise, Id.

[21] Appl. No.: 696,406

[22] Filed: May 6, 1991

[51] Int. Cl.⁵ .................... H01L 29/68; H01L 29/34
[52] U.S. Cl. ........................... 357/23.5; 357/54
[58] Field of Search ................... 357/23.5, 54

[56] References Cited

U.S. PATENT DOCUMENTS

| | | | |
|---|---|---|---|
| 4,455,568 | 6/1984 | Shiota | 357/23.5 |
| 4,822,750 | 4/1989 | Perlegos et al. | 437/52 |
| 4,947,221 | 8/1990 | Stewart et al. | 357/23.5 |
| 5,043,780 | 8/1991 | Fazan et al. | 357/23.6 |

*Primary Examiner*—Rolf Hille
*Assistant Examiner*—Robert P. Limanek
*Attorney, Agent, or Firm*—Stanley N. Protigal

[57] ABSTRACT

Floating gates for EPROMs, E²PROMs, Flash E²PROMs, and other devices are texturized to provide more surface area than previous gate designs. Ruggedizing the upper surface of the floating gate causes texturization of an oxide-nitride-oxide layer formed superjacent to the floating gate, which causes texturization of the lower surface of the control gate formed thereupon resulting in increased coupling between the two gates. The oxide-nitride-oxide layer between the floating gate and control gate allows increased capacitance without allowing leakage of electrons between the two gates as would a layer of oxide which is normally used. The invention allows a smaller feature width, and therefore a higher density EPROM. Increased speed results from the reduced feature size.

22 Claims, 2 Drawing Sheets

HIGH CONTROL GATE/FLOATING GATE COUPLING FOR EPROMS, E²PROMS, AND FLASH E²PROMS

FIELD OF THE INVENTION

This invention relates to the field of semiconductor devices. More specifically, a structure is described which increases the control gate/floating gate coupling of programmable read-only memories (PROMs), specifically erasable PROMs (EPROMs), electrically erasable PROMs (E²PROMs), and Flash E²PROMs, thereby allowing smaller cell sizes.

BACKGROUND OF THE INVENTION

An EPROM has several structures which allow it to hold a charge without refresh for extended periods of time (see FIG. 1). The charge itself is stored on a "floating gate" 10 also referred to as Poly 1 or P1, which is a structure of polycrystalline silicon surrounded on all sides by a layer of oxide 12. Located superjacent and parallel to this P1 structure is another poly structure, the "control gate" 14 or P2. P1 10 and P2 14 act as the two plates of a capacitor. Below the P1 layer are two N+ junctions, one which acts as the transistor source 16 and the other as the drain 18, which are doped into a p-type substrate 20. The portion of the substrate 20 between the source 16 and the drain 18 is the channel 22. The cell of FIG. 1 functions like an enhancement-type n-channel metal oxide semiconductor field effect transistor (MOSFET) with two gates of polysilicon.

To program an E²PROM, a ground voltage is applied either on the drain or the source. Simultaneously, a large voltage, for example 25 V, is applied to the control gate. An n-type inversion layer (channel) is created at the substrate surface below the floating gate as a result of the large voltage applied to the control gate. The large positive voltage on the control gate (greater than the drain voltage) establishes an electric field in the insulating oxide. This electric field attracts the electrons and accelerates them toward the floating gate, which they enter through a "tunneling window" in the oxide. In this way the floating gate is charged, and the charge that accumulates on it becomes trapped.

To return the floating gate from a charged state to a state with no charge, the charge is returned to the substrate. In an EPROM, this is accomplished with ultraviolet light which excites the electrons past a certain energy state, thereby allowing them to pass through the oxide and return to the substrate. In an E²PROM, this excitation is accomplished with an electrical field.

The voltage which must be applied on the control gate to turn on the transistor (i.e. the threshold voltage $V_t$) is much higher in a device storing a charge than in a device which does not have a voltage potential stored on P1. To read the content of the floating gate, a voltage somewhere between the low and high threshold values is applied to the control gate. A cell that trips at this intermediate voltage has no charge stored on P1, while a cell which does not trip is determined to be storing a charge.

As with most electronic devices, design engineers attempt to devise PROMs which use as little power as possible in order to increase integration density of the PROM. This includes power used to program the PROMS as well as operating power. One way to decrease power consumption is to decrease the cell size, which also serves to decrease the time it takes to access the information on the floating gate. Decreasing the size of an EPROM includes decreasing the width of P1 and P2, with a similar reduction in the width of the channel. Decreasing the P1 and P2 widths, however, decreases the coupling capacitance between P1 and P2, which increases the likelihood of errors while reading the cell charge.

The floating gate of an EPROM forms a capacitor with the control gate, as described above, and also with the source, the drain, and the channel. This arrangement is described in FIG. 2. If the surface areas of P1 and/or P2 are increased, P1 and P2 can be reduced in width while maintaining the same coupling capacitance between P1 and P2. The coupling capacitances associated with P1 are described by the coupling coefficient, which is depicted by the equation (referring to FIG. 2)

$$CC = C1/(C1 + C2 + C3 + C4)$$

where CC is the coupling coefficient, C1 represents the coupling between P1 and P2, C2 represents the coupling between P1 and the source, C3 represents the coupling between P1 and the drain, and C4 represents the coupling between P1 and the channel. As an example, if C1=0.5, C2=0.1, C3=0.1, and C4=0.3, the coupling coefficient would equal 0.5 (50%). If the area of the surface of P1 proximal to P2 is increased by 100%, C1 would increase to 1.0, and CC would increase to 0.67 (67%). With this increase, the size of P1 and P2 could be decreased by 50%, which would reduce CC by 17% back to the original 50%. As can be determined from the equation, the coupling coefficient can never reach the ideal state (1.00) since the capacitance between the floating gate and the control gate is always divided by itself plus some additional capacitance. Still, the goal of designers is to bring the coupling coefficient as close to unity as possible.

Texturized (rough or rugged) polysilicon has been used with varying success in the manufacture of certain types of semiconductor devices. It has been used with dynamic random access memories (DRAMs), for example, to increase the surface area of the storage node cell plate. This increases the charge that can be stored on the node, and allows a decrease in the size of the DRAM, and therefore an increase in the density of the DRAM, while maintaining an equal charge on each storage node.

Rugged poly on semiconductor devices has been accomplished in mainly two ways. The first way is to control the temperature at which the poly is deposited. If the poly is deposited at a narrow temperature band around 570° C. (±3° C.) a rough texture is imparted to the poly, thereby increasing the surface area of the poly. A second way the poly surface is ruggedized is to oxidize the poly and etch it with hydrofluoric acid. Regardless of the method, any material such as oxide, which is then deposited on top of the rough poly, will itself be texturized. If the layer of material deposited on the texturized poly is thin, both its lower and upper surface will be texturized. A thick layer of material will be texturized on its lower surface, but untexturized on its upper surface.

Rugged poly has been used in the manufacture of some E²PROMs to increase the electrical field intensity through the tunneling window in the substrate to make it easier to transfer electrons to the floating gate, thereby increasing program efficiency. For example, U.S. Pat. No. 4,947,221 describes the use of rugged poly on the upper surface of a floating gate on an EPROM. The use of rugged poly decreases the distance between the floating gate and the control gate, and therefore increases leakage between the two gates, thereby requiring less power to program the device. With this device, the tunneling window is between the control gate and the floating gate. The reduced distance of the two gates through the oxide layer between them makes it easier for the electrons to tunnel through the oxide layer.

SUMMARY OF THE INVENTION

An object of the invention is to provide a programmable read-only memory (PROM) which requires lower voltage than previous PROM designs. Another object of the invention is to provide a PROM which is more dense than previous PROM designs. A further object of the invention is to provide a PROM which can be accessed faster than previous PROM designs as a result of its smaller feature size which serves to decrease signal propagation delay. These objects are accomplished by texturizing the poly of the floating gate on the side proximal to the control gate, and separating the two gates with a layer of oxide-nitride-oxide (ONO) to prevent the transfer of electrons between the control gate and the floating gate.

As the thin ONO layer is deposited on top of the poly of the floating gate, it too will be texturized, which will in turn texturize the lower surface of the control gate proximal to the floating gate. The poly of the control gate is thick when compared to the extent of the texturization, and the upper surface of the control gate poly is not affected by the texturization. Increasing the surface areas of the floating gate and the control gate will serve to increase the coupling between P1 and P2, which will allow a size reduction of P1 and P2, and therefore of the EPROM, E$^2$PROM, or Flash E$^2$PROM itself.

The use of ONO to separate the two gates allows the texturizing to increase the coupling without increasing the leakage between the two devices. Increasing the leakage which is the object of the related art patent previously described, is to be avoided with this invention. With the inventive approach described herein, the tunneling window is between the substrate and the floating gate, not between the floating gate and the control gate. Thus oxide separates the substrate and the floating gate thereby allowing a tunneling window between the substrate and the floating gate. In the related art, oxide is used to enhance the electric field through the textured poly and separates the substrate from the floating gate and the floating gate from the control gate, while in the present invention, ONO is used to avoid increasing the electric field between the floating gate and the control gate while allowing an increase in the effective surface area to achieve maximum capacitance. The coupling efficiency is increased, thereby allowing a reduction in cell size. Alternately, if the cell size is not changed, the voltage can be reduced in order to achieve a higher electric field in between the floating gate and the substrate. In the related art invention, this would increase the electric field between the floating gate and the control gate.

Texturizing the poly of P1 and P2 as described can allow a decrease in the size of these two structures, up to 50% and higher, depending on the degree of texturization.

FIG. 3 shows the inventive structure. The upper surface of the floating gate 30 and the lower surface of the control gate 32 are texturized, and the oxide which separates the two gates is replaced in the inventive module with ONO 34.

DETAILED DESCRIPTION OF THE PREFERRED EMBODIMENT

Figure 1:
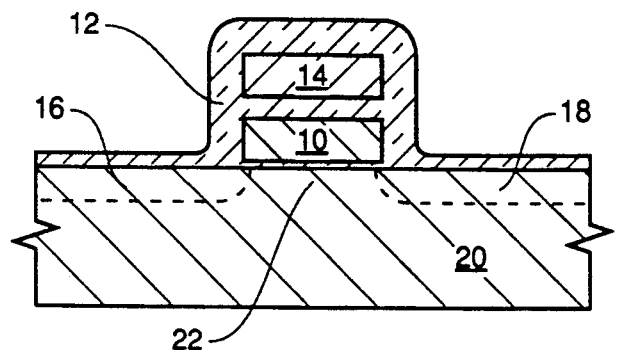
FIG. 1 shows a cross section of the cell structures of an EPROM.
Figure 2:
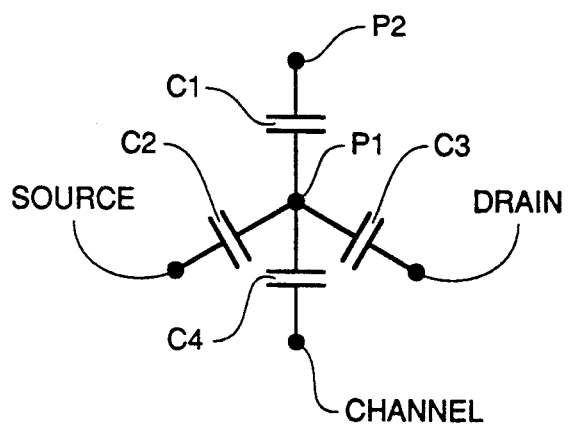
FIG. 2 shows the capacitances associated with the cell structures of an EPROM.
Figure 3:
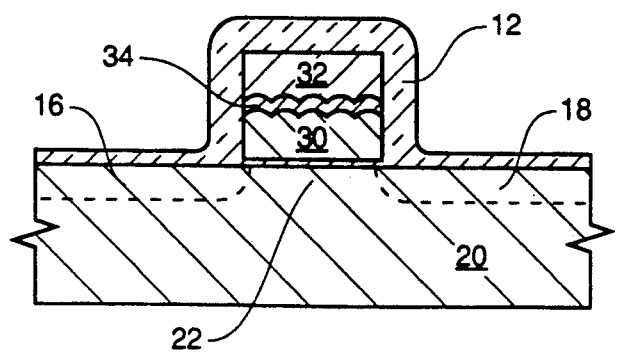
FIG. 3 shows a cross section of the cell structures of the inventive design with texturized floating and control gates, and ONO separating the two gates.

To manufacture the inventive device of FIG. 3, a wafer is processed up to the point of fabricating the EPROM cell structure by using conventional process steps. The inventive EPROM cell structure can be manufactured by the following steps, as described by FIGS. 4 and 5.

Figure 4:
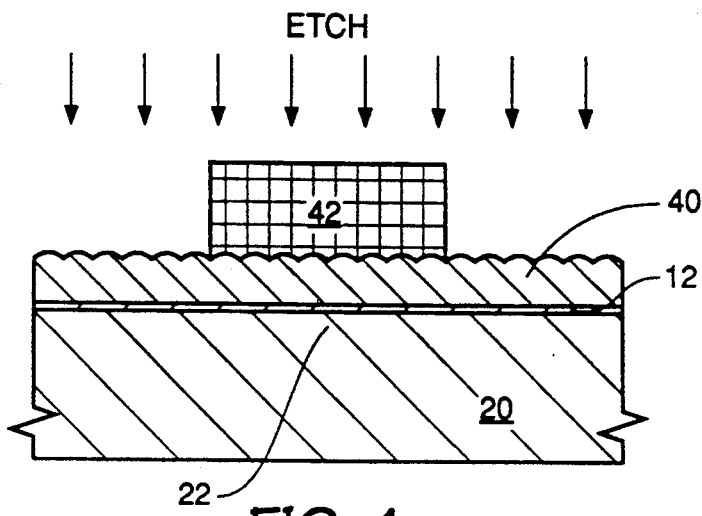
FIG. 4 shows the cell fabrication up to the addition of the first layer of photoresist.

The first set of completed steps are shown in FIG. 4. The wafer is formed with a p-type substrate 20, on which will be formed a transistor. Next, a blanket layer of gate oxide 12 is grown or deposited on the surface of the substrate 20. Then a texturized blanket layer of poly 40 is formed on the gate oxide layer 12, and a first protective photoresist layer 42 is patterned over the poly layer 40, the oxide layer 12, and the channel 22. The poly layer 40 is etched away down to the gate oxide 12 leaving a poly structure 30 superior to the channel 22, the poly feature forming the floating gate 30 of FIG. 5.

Figure 5:
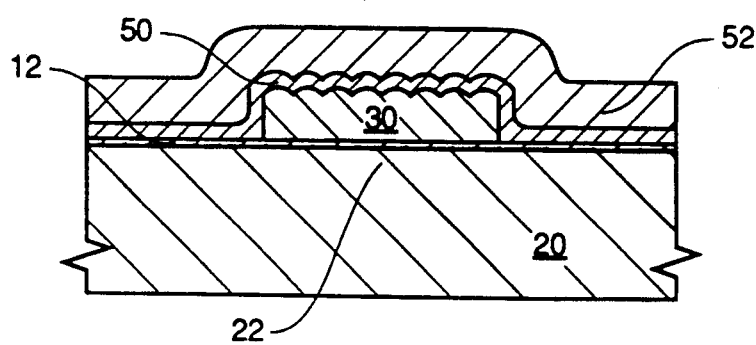
FIG. 5 shows the cell fabrication up to the addition of the second layer of poly (the control gate).

As shown in FIG. 5, a blanket layer of ONO 50 is formed on the poly of the floating gate 30, then a second blanket layer of poly 52 is formed.

After completion of the above steps, wafer processing continues (such as formation of the transistor source and drain) using conventional EPROM manufacturing techniques.

The invention is generally concerned with the texturized poly layer 40 formed on the gate oxide layer 12, and with the layer of ONO 50. The poly 40 which will make up the floating gate 30 is texturized. Additionally, the layer 50 deposited on the floating gate 30 comprises ONO rather than oxide of a PROM of previous design.

It has been shown in the manufacture of DRAMs that depositing poly at a certain narrow band of temperature (570° C.±3° C.) texturizes the surface of the poly. The poly can also be texturized by forming the poly layer and texturizing the layer with a corrosive substance, for instance hydrofluoric acid. Other texturizing means may be possible.

In any case, the texturizing, while changing the characteristics of the poly grain sizes within the texturized poly, serves to increase the surface area of the poly feature. This poly feature, in the case of the invention, is the floating gate. Since the ONO layer is deposited on top of the texturized floating gate, and the poly control gate is deposited on the ONO layer, these two layers will follow the contours of the texturized poly layer and will themselves be texturized. This will increase the surface area of the control gate as well as the floating gate, thereby improving the coupling between P1 and P2.

What has been described is a specific configuration of the invention, as applied to a particular embodiment. Clearly, variations can be made to the original process described in this document for adapting the invention to other embodiments. The inventive gate may be used with structures other than EPROMs, E²PROMs, and Flash E²PROMs. Therefore, the invention should be read as limited only by the appended claims.

I claim:

1. A transistor memory cell for an electronic device, comprising:
    a) a substrate having spaced source and drain regions and a channel region therebetween;
    b) a first insulating layer disposed on said channel region;
    c) a floating gate disposed on said first insulating layer, a portion of said floating gate being positioned over said channel region, to for a first capacitor having a first capacitance with said substrate, said floating gate having a surface which is texturized, wherein said texturization of said floating gate surface increases the area of said surface;
    d) a second insulating layer disposed on said floating gate, wherein said second insulating layer prevents the tunneling of electrons between said floating gate and said control gate; and
    e) a control gate disposed on said second insulating layer, said control gate forming a second capacitor having a second capacitance with said floating gate.

2. The transistor memory cell of claim 1 wherein said substrate comprises silicon.

3. The transistor memory cell of claim 1 wherein said texturized surface of said floating gate is formed by the deposition of a material at a controlled temperature.

4. The transistor memory cell of claim 3 wherein said temperature is between 566° C. and 574° C.

5. The transistor memory cell of claim 1 wherein said texturized surface of said floating gate is formed by exposing said surface to a corrosive material.

6. The transistor memory cell of claim 5 wherein said corrosive material is hydrofluoric acid.

7. The transistor memory cell of claim 1 wherein the electronic device transfers electrons between said substrate and said floating gate.

8. The transistor memory cell of claim 7 wherein the electronic device is an EPROM.

9. The transistor memory cell of claim 7 wherein the electronic device is an E²PROM.

10. The transistor memory cell of claim 7 wherein the electronic device is a Flash E²EPROM.

11. The transistor memory cell of claim 1 wherein said second layer comprises oxide and nitride.

12. A transistor memory cell for an electronic device, comprising:
    a) a substrate having spaced source and drain regions and a channel region therebetween, said source, drain, and channel regions forming a transistor;
    b) a first insulating layer disposed on said channel region;
    c) a floating gate disposed on said first insulating layer, a portion of said floating gate being positioned over said channel region, to for a first capacitor having a first capacitance with said substrate, said floating gate having top and bottom surfaces wherein said top surface is texturized, wherein said texturization of said top surface of said floating gate increases the area of said top surface;
    d) a second insulating layer disposed on and conformal with said floating gate, said second insulating layer having texturized top and bottom surfaces thereby, wherein said second insulating layer prevents the tunneling of electrons between said floating gate and said control gate; and
    e) a control gate having top and bottom surfaces, said control gate being disposed on said second insulating layer, said bottom surface of said control gate being conformal with said second insulating layer top surface and being texturized thereby, and said control gate forming second capacitor having a second capacitance with said floating gate.

13. The transistor memory cell of claim 12 wherein said substrate comprises silicon.

14. The transistor memory cell of claim 12 wherein said floating gate is formed by depositing the material of said floating gate at a controlled temperature.

15. The transistor memory cell of claim 14 wherein said temperature is between 566° C. and 574° C.

16. The transistor memory cell of claim 12 wherein said top surface of said floating gate is texturized by exposing said surface to a corrosive material.

17. The transistor memory cell of claim 16 wherein said corrosive material is hydrofluoric acid.

18. The transistor memory cell of claim 12 wherein the electronic device transfers electrons between said substrate and said floating gate.

19. The transistor memory cell of claim 18 wherein the electronic device is an EPROM.

20. The transistor memory cell of claim 18 wherein the electronic device is an E²PROM.

21. The transistor memory cell of claim 18 wherein the electronic device is a Flash E²PROM.

22. The transistor memory cell of claim 12 wherein said material comprises oxide and nitride.

* * * * *

UNITED STATES PATENT AND TRADEMARK OFFICE
CERTIFICATE OF CORRECTION

PATENT NO. : 5,089,867
DATED : February 18, 1992
INVENTOR(S) : Ruojia Lee

It is certified that error appears in the above-indentified patent and that said Letters Patent is hereby corrected as shown below:

Column 6, line 12, delete "for" and insert ---form---.

Signed and Sealed this

Twenty-seventh Day of September, 1994

BRUCE LEHMAN

Attest:

Attesting Officer

Commissioner of Patents and Trademarks